United States Patent
Lin

(10) Patent No.: US 8,673,662 B2
(45) Date of Patent: Mar. 18, 2014

(54) LIGHT-EMITTING DIODE CUTTING METHOD AND PRODUCT THEREOF

(76) Inventor: Tien-Tsai Lin, Taipei (TW)

( * ) Notice: Subject to any disclaimer, the term of this patent is extended or adjusted under 35 U.S.C. 154(b) by 780 days.

(21) Appl. No.: 12/511,078

(22) Filed: Jul. 29, 2009

(65) Prior Publication Data

US 2011/0027927 A1 Feb. 3, 2011

(51) Int. Cl.
H01L 21/00 (2006.01)
(52) U.S. Cl.
USPC ............ 438/29; 438/33; 438/113; 438/462; 257/98; 257/E33.006; 257/E33.055; 257/E33.068; 257/E33.071; 257/E33.074
(58) Field of Classification Search
CPC ......... H01L 33/58; H01L 21/50; H01L 33/08; H01L 33/20
USPC .................. 438/33, 113, 114, 460–466, 110, 438/FOR. 386, 29; 257/E21.238, E33.055, 257/E33.067–E33.071, E33.073, E33.074, 257/E33.068, E21.214, E21.237–E21.239, 257/E21.483, E33.066; 451/28, 41–44
See application file for complete search history.

(56) References Cited

U.S. PATENT DOCUMENTS

| 2,911,773 | A * | 11/1959 | Gobat | 451/41 |
|---|---|---|---|---|
| 7,195,942 | B2 * | 3/2007 | Eisert et al. | 438/33 |
| 7,390,117 | B2 * | 6/2008 | Leatherdale et al. | 362/555 |
| 7,563,155 | B2 * | 7/2009 | Kumagai et al. | 451/165 |
| 7,939,841 | B2 * | 5/2011 | Lee et al. | 257/98 |
| 2001/0053618 | A1 * | 12/2001 | Kozaki et al. | 438/933 |
| 2006/0094322 | A1 * | 5/2006 | Ouderkirk et al. | 445/24 |
| 2006/0094340 | A1 * | 5/2006 | Ouderkirk et al. | 451/41 |
| 2006/0278883 | A1 * | 12/2006 | Negley | 257/98 |
| 2007/0116423 | A1 * | 5/2007 | Leatherdale et al. | 385/146 |
| 2007/0128767 | A1 * | 6/2007 | Nakamura | 438/113 |
| 2008/0012034 | A1 * | 1/2008 | Thielen et al. | 257/98 |
| 2010/0102341 | A1 * | 4/2010 | Tsutsumi et al. | 257/98 |

FOREIGN PATENT DOCUMENTS

| JP | H04-356924 | * 12/1992 | H01L 21/304 |
|---|---|---|---|
| JP | 2006-319214 | * 11/2006 | H01L 21/301 |
| JP | 2007-83332 | * 4/2007 | B26D 1/08 |

OTHER PUBLICATIONS

English translation, Kagawa, Japanese Pat. Pub. No. H04-356924, translation date: Nov. 2013, Phoenix Translations, all pages.*
Machine translation, Kiyu, Japanese Pat. Pub. No. 2006-319214, translation date: Oct. 31, 2013, JPO & Japio, all pages.*
Machine translation, Kakimoto, Japanese Pat. Pub. No. 2007-83332, translation date: Oct. 31, 2013, JPO & Japio, all pages.*

* cited by examiner

*Primary Examiner* — Fernando L. Toledo
*Assistant Examiner* — Victoria K Hall

(57) ABSTRACT

A light-emitting diode (LED) cutting method includes the following steps:
positioning and retaining an LED die or an LED epitaxial substrate on a die retainer; introducing a liquid medium for preventing reflection of sound wave between a cutting tool and the die; activating a power source to drive a magnetostrictive material or piezoelectric ceramic material mounted on a machine to serve as a kinetic source by inducing volume expansion/compression that generates an up-and-down piston-like movement; and operating the cutting tool having super hard micro-particles of diamond, CBN, or SiC electroformed on the cutting tool to perform breaking cutting on an LED workpiece.

12 Claims, 6 Drawing Sheets

LIGHT-EMITTING DIODE CUTTING METHOD AND PRODUCT THEREOF

TECHNICAL FIELD OF THE INVENTION

The present invention generally relates to a light-emitting diode (LED) cutting method and a product thereof, and more particularly to a cutting method wherein electrically driven magnetostrictive or piezoelectric ceramic materials are used to serve as a power source that generate expansion/contraction of volume to induce an up-and-down piston-like motion, and a cutting tool having an end face to which electroformed super hard micro-particles of diamond, CBN and SiC are employed to carry out cutting operation on an LED chip or an LED epitaxial substrate retained on a chip retainer, whereby with the micro-particles of the cutting tool being intermittently driven into the workpiece, a large impacting force can be generated through small area of contact, and a product produced with the cutting method, including an LED die product having facets that are parallel and coarse, or an LED die product having facets that are non-parallel and coarse, or a product having facets that are parallel and forming successive raised/recessed prism-like projections, or a product having facets that are non-parallel and forming successive raised/recessed prism-like projections, or a product having facets that are conic, non-parallel, and forming successive raised/recessed prism-like projections.

Especially partial cutting of an LED epitaxial substrate having ($1/4$) $\lambda$ periodic successive steps, wherein the epitaxial substrate has successive periodic steps of which two adjacent ones having surfaces that have a height difference of odd times of ($1/4$) $\lambda$ optic thickness, whereby when processing reaches a difference between the last step and the substrate that is odd times of relative wavelength ($1/4$) $\lambda$ optic thickness, the partial cutting operation of the LED epitaxial substrate is stopped. The successive height difference provides stepped periodic distribution on the LED epitaxial substrate to thereby reduce occurrence of stress in subsequent processing and increase the chance of light overlapping of reflection light or transmission light. The successive periodic step-like height difference produces an LED epitaxial substrate.

The present invention relates to an LED cutting method and a product thereof, and more particularly to a cutting tool that imposes a three-dimensional optic structure to a product LED or LED epitaxial substrate.

DESCRIPTION OF THE PRIOR ART

Heretofore, in carrying out the LED chip cutting operation, the cutting of chip is done with wire cutting or cutting with internal edge circular cutter or external edge circular cutter, and the cutting is performed with a friction based or linear motion based cutting operation. Due to abrasion, diamond particles attached to the wire or cutter can be detached by shearing force so that the processing efficiency is low and the loss of consuming parts is great. Further, abrasion cutting leads to only symmetric smooth facets, which offer only a two-dimensional optic structure, whereby the light emanation efficiency and quality of LED products are affected. The material of LED is often a high refractivity material of group III-VI, which has a refractivity of 3-3.5. According to Snell's law, there will be a loss of $(3^{1/3}+1)^2=25\%$, and most of the light will be in-site reflected back into the LED crystal to oscillate and thus induce heat, leading to the occurrence of thermal loss. Namely, a temperature increase of 1° C. causes a reduction of 1.5% loss of light emission. This is the first factor for poor light emanation efficiency. Next, the high refractivity material of Group III-VI has a small critical angle, so that when light incidence angle is greater than the critical angle, light cannot enter the second medium and will be completely reflected back to the first medium, this being referred to as "total reflection". (Namely, in moving from $n_1$ (refractivity of the first medium) into $n_2$ (refractivity of the second medium), when $n_1 > n_2$, the critical angle $\theta$ is obtained by the following formula: $n_1 \sin \theta = n_2 \sin 90°$.) Due to the smooth and symmetric facets and a small critical angle, which lead to a loss of total reflection of light, the light emanation efficiency is further reduced. This is the second factor for poor light output efficiency of LED. Although the light emission efficiency of the conventional chip is quite complete, the light emanation efficiency of the known LED is only 20%. The known techniques only improve the post-processing of die with respect to the light output efficiency. Typical examples include: a flip chip LED, a chip-mounted LED or an organic lens packaged LED. The state-of-the-art best light emanation efficiency is realized by non-parallel grinding of an LED die made by the HP company, which may be as high as 45%. However, using the conventional grinding techniques to make non-parallel facets is a slow processing and the selection of material is subjected to strict limitation. For example, if $Al_2O_3$ is used in an LED epitaxial substrate, Mohs' hardness is as high as 9, close to the hardness of diamond, making it very hard to grind. Further, the processed surface is very smooth, causing a drawback of being easy to reflect light.

For the techniques that improve brightness of an LED substrate, the best is that disclosed in Taiwan Invention Patent Publication No. 508841 issued to a Japanese company, Nichia Chemical Co., Ltd., which forms a protection layer of periodic strip-like, grid-like or island-like openings. However, the protection layer is coated with a heterogeneous material $SiO_2$, followed by etching operation. This causes a drawback of easily inducing stress and increasing etching engineering due to the heterogeneity. A comparison of the advantages and disadvantages between the present invention and the conventional LED epitaxial carrier substrate is given in the following Table 1.

TABLE 1

Comparison table of light-emitting diode epitaxial substrate product of the present invention and the known product

| type | the present invention | Nichia Chemical |
| --- | --- | --- |
| cutting principle | breaking cutting | etching cutting |
| substrate material | homogeneous | heterogeneous |
| layer of processing | at least one layer | only one layer |
| optic characteristics | excellent brightness enhancement | good |

The LED cutting method and the product thereof in accordance with the present invention are provided for overcoming the above drawbacks. The LED die product can be of facets that show a coarse and corrugated configuration for effectively improving the reflection angle, reducing in-site reflection of light back into the die, reducing thermal loss caused by oscillation of light inside the die, and improving light output efficiency of the LED. A comparison of the advantages and disadvantages of the processing operation between the present invention and the known techniques is given in the following Table 2.

TABLE 2

Comparison of light-emitting diode product of the present invention and the known product

| comparison type | the present invention | wire cutting | external edge circular cutter |
|---|---|---|---|
| cutting principle | impact breaking | abrasion | abrasion |
| cutting direction | vertical cutting | horizontal cutting | horizontal cutting |
| optic lens | yes | no | no |
| cutting efficiency | fast | slow | moderate |
| strange shape cutting | yes | no | no |
| cut facet | coarse and corrugated | smooth | smooth |
| cutting manner | intermittent | continuous | continuous |

SUMMARY OF THE INVENTION

In view of the fact that the processing operations that are currently carried out on LED chips or LED epitaxial substrates suffer the above drawbacks, the present invention aims to provide an LED cutting method and a product thereof, as will be fully described herein.

An objective of the present invention is to provide a breaking cutting method applied to hard and brittle LED chips to impose optic characteristics to the processed LED dies so as to provide an LED die product of excellent optic efficiency.

Another objective of the present invention is to provide an LED partial cutting method, which carries out partial cutting on hard and brittle LED chips to increase processing speed and at the same time protect a chip retainer from damage by a cutting tool and also impose optic characteristics to the processed LED so as to provide an LED die product of excellent optic efficiency.

A further objective of the present invention is to provide an LED epitaxial substrate partial cutting method, which carries out partial cutting on hard and brittle LED epitaxial substrates to impose three-dimensional optic characteristics to surfaces of the processed LED epitaxial substrate so as to provide an LED epitaxial substrate product that facilitates light overlapping of transmitted light or reflective light.

Yet a further objective of the present invention is to provide a cutting tool for performing an LED cutting method, which serves as a cutting tool for cutting or partial cutting of hard and brittle LED or LED epitaxial substrates so as to produce a product that is complementary to the surface of the cutting tool and imposing three-dimensional optic characteristics to the processed LEDs or LED epitaxial substrate.

To achieve the objectives of the present invention, an acting force induced by up-and-down piston-like motion caused by expansion or contraction of volume of magnetostrictive or piezoelectric ceramic material that is electrically driven (namely conversion of electrical energy into mechanical energy) is used as a power source for breaking cutting of a light-emitting diode chip or partial cutting of LED epitaxial substrate. A cutting edge of a proper shape that has a surface carrying electroformed super hard micro-particles of diamond or CBN or SiC serves as a cutting tool. A sound-wave reflection prevention liquid medium serves as a sound-wave reflection prevention layer between the tool and the chip. A chip retainer serves to retain the LED chip or LED epitaxial substrate for the cutting operation. When performing the cutting operation, the super hard micro-particles of diamond, CBN or SiC as formed on the cutting edge of the cutting tool may generate a large impacting force on a small contact area on the hard and brittle LED die or LED epitaxial substrate material by intermittently driving the cutting tool into the LED die or the LED epitaxial substrate. The maximum number of processing operations can be achieved in a shortest period of time. For example, it may be applied with a power source of 50 KHZ, with fifty-thousand cutting cycles per second, and each cycle having a cutting depth of 0.16 μm. This is much faster than the conventional friction force linear motion. HZ (frequency) is dependent on the load. When the cutting gets deeper into the bottom of the die, the contact area gets larger, whereby the resistance is increased and a hard impact occurs. Conventional mechanical processing, once encountering such a hard impact, often results in damage of either the processed object or the processing tool. The power source used in the present invention is magnetostrictive or piezoelectric ceramic material that converts electrical energy into mechanical energy so that when the load increases, the frequency is automatically reduced to lower the hard impact applied to the processed object. Thus, it is particular particularly fit for the breaking cutting operation of a hard and brittle material, such as LED chips or LED epitaxial substrates. The operation comprises the following steps:

A. Positioning and retaining an LED chip to be processed on a chip retainer for subsequent use.

B. Activating a liquid medium to flow between a cutting tool and the chip to serve as a sound wave reflection layer medium and also serving as a coolant for the cutting tool and the chip and functioning for removal of wastes.

C. Activating an electrical power source to drive a magnetostrictive material or piezoelectric ceramic material to induce volume expansion/compression that generates impacting force of up-and-down piston-like movement.

D. Operating the cutting tool that has a surface on which super hard micro-particles of diamond, CBN, or SiC are electroformed to intermittently force the micro-particles on the cutting edge into the LED chip workpiece to generate a large impacting force through small contact area for carrying out breaking cutting. With the above four steps, the LED cutting method is completed.

It often damages the surface of the chip retainer if the cutting operation is carried out to completely cut of the chip into dies. Thus, the present invention comprises Da. carrying out the cutting operation to such an extent that it cuts a predetermined thickness at which the cutting operation is stopped, or E. removing and subjecting the LED die to a high temperature gradient so as to cause the die product to break due to thermal shock. With the above five steps A, B, C, D/Da, E, the LED partial cutting method is completed.

The partial cutting method for LED as described above further comprises, during the partial cutting operation applied to an LED epitaxial substrate material, forming on a surface of the substrate material a three-dimensional optic structure having high and low steps of odd number times of successive periodic (¼) λ optic thickness. (LED emanates single color light and thus (¼) λ optic thickness means corresponding wavelength of LED light.) The operation is carried out to such an extent that the surface forms successive (¼) λ periodic high-and-low stepped epitaxial substrate.

F. Removing and subjecting the LED epitaxial substrate to chemical polishing with fluorides or fluoric acid to produce an LED epitaxial substrate. With the above five steps A, B, C, D/Da, and F, the LED epitaxial substrate partial cutting method is completed.

The LED cutting method of the present invention is to improve the conventional LED die cutting methods by using breaking cutting to replace abrasion cutting so that in a one-time cutting operation, an LED die with optic characteristics is produced and the problem of having only high lighting efficiency but with low light emanation efficiency is overcome. For an LED epitaxial substrate product, it is to improve the manufacturing way of the conventional epitaxial substrate material by replacing heterogeneous materials with homogeneous materials in order to reduce stress induced by heterogeneity, such as U.S. Pat. No. 508,841 owned by a Japanese company, which forms a $SiO_2$ protection layer on a $Al_2O_3$ surface, of which the hardness, thermal conductivity, and expansion coefficient are quite different between these two. Further stress may be easily induced in epitaxy in a high temperature environment. The present invention uses successive (¼) λ periodic height difference steps to replace the protection layer for creating the optimum optic phase matching environment, increasing the chance of light overlapping to thereby enhance brightness. The (¼) λ height difference steps provide different optic path distance to light transmission so as to cause light leading or lagging, whereby the lagging light may overlap the leading light so as to enhance the brightness. The LED epitaxial substrate partial cutting method of the present invention overcomes the problem of stress of the LED epitaxial substrate and provides an LED epitaxial substrate product of enhanced brightness.

Due to up-and-down intermittent impacting operation, the cutting method upgrades the conventional two-dimensional cutting to three-dimensional cutting, wherein the shape of the cutting tool provides a tool for making a three-dimensional optic structure. The cutting tool of the present invention is made of a material selected from one of titanium, steel, and aluminum and is subjected to high precision machining to make the cutting tool. The cutting edge of the tool is provided with super hard particles of diamond, CBN or SiC through electroforming. Partial shape of the cutting edge is complementary to the shape of a processed object. If the cutting edge has two parallel faces, then a product die formed by the cutting has facets that are parallel and coarse. If the cutting edge has two faces that are parallel and the edge surface forms a micro-structure of arrangement of successive prism-like projections, then the product die formed by the cutting has facets that are parallel and coarse and of prism-like projections. If the cutting edge has two faces that form a sharp configuration and are not parallel, then the product die formed by the cutting has facets that are non-parallel and coarse. If the cutting edge has two faces that form a sharp configuration and are not parallel and have a micro-structure of successive arrangement of prism-like projections, then the product die formed by the cutting has facets that are non-parallel and coarse and form prism-like projections. If the cutting edge is of raised successive steps, then the product die formed by the cutting has recessed successive steps. The design of the cutting tool that gives a product having an optic structure will be explained as follows: The facets of the cut product die are coarse and the coarse facets can scatter light so that reflected light is not of in-side reflection back into the die. Using a successive-curved-faced cutting tool to carry out cutting operation by inducing up-and-down impacting force in a vertical direction of a surface of LED die will form a product having facets that form successive prism-like arrangements and the product die facets form prism-like lenses that are of the simplest aspheric optic configuration so that when light transmits through a meridian plane of the prism-like lens to exit, the scattering ratio is maintained unchanged, but for non-meridian plane, due to radius of curvature, unequal amount of refraction occurs. The unequal amount of refraction effectively increases the critical angle to overcome total reflection, so as to improve light output efficiency, and this is applicable to any prism-like lens, such as semi-circular, triangular, and rectangular prism-like lens all offering excellent-results. Using a non-parallel sharp edge cutting tool to cut and break an LED chip, the actuate angle α is taken an angle that is greater than zero degree but smaller than the critical angle of the material to serve as a non-parallel tool angle. The cutting tool angle reduces in-site of light reflection back into the die and reduces the total reflection of light. Using a prism-like cutting tool with a metal end forming raised or recessed step-like conic end with particles of diamond or the likes attached to the conic end can be applied to carry out partial cutting to a surface of a board of $Al_2O_3$, SiC, GaN, $MgAl_2O_4$, ZnS, ZnO, GaAs, $SiO_2$, or Si to form an epitaxial substrate having a surface forming periodic successive inward recessed or outward protruding steps smaller than dies. The inward recess or outward protrusion respectively comprise at least one or more than one inward recessed or outward protruding step. The inward recessed or outward protruding step can be circular, hexagonal, or rectangular. The more the steps, the smaller the unit area is. The smaller the unit area, the smaller the stress of the epitaxy will be. The smaller the stress, the less the lattice defect will be. The more the steps, the better the light overlapping can be. The overlapping light offers brightness enhancement of square of cosine, so that an LED epitaxial substrate of enhanced brightness can be made.

In the course of carrying out the LED cutting method of the present invention, a liquid coolant must be introduced to flow into the power source of the machine for cooling the heat generated by the up-and-down piston-like movement and then flow through the cutting tool to drip onto the chip and the chip retainer to simultaneously serve as a coolant and a sound wave reflection prevention layer between the cutting tool and the cut LED chip or LED epitaxial substrate, and to remove the waste generated by the cutting tool by serving as a cleaning liquid medium.

The LED cutting method and the LED die product formed by the cutting tool in accordance with the present invention have a surface that is formed as a coarse surface corresponding to the particle size of micro-particles attached to the cutting edge of the cutting tool. The outside surface formed by the cutting tool has a shape comprising: planar configuration having parallel or non-parallel surfaces corresponding to the edge surface shape of the cutting tool or a raised/recessed facial configuration composed of an arrangement of triangular, rectangular, or curved prism-like projections for expanding the light reflection angle of the LED die to prevent in-site reflection of light back into the die and offer aspheric optic characteristics to improve light output efficiency of the LED.

For performing the above mentioned LED partial cutting method for forming successive steps of which adjacent ones having surfaces that have a height difference of odd times of wavelength (¼) λ on a surface of an LED epitaxial substrate, a plurality of periodic successive recessed or raised steps are formed on the substrate surface, each step having a height equal to odd times of (¼) λ optic thickness of the LED light wavelength, thereby making light emission through parallel surfaces of a unit die on the LED epitaxial substrate to exert a time lag of (¼) λ, allowing a leading light to superimpose on a later coming light to facilitate overlapping of light so as to further enhance the brightness of LED.

The present invention offers the following efficacies:

(1) In the performance of LED chip cutting, the same cutting operation can provide a light-emitting diode die of optic characteristics and help improve light output efficiency.

(2) In the LED cutting method, the direction of processing is changed from two-dimensional left-and-right abrasion cutting to three-dimensional up-and-down cutting so as to provide the LED die with a three-dimensional optic structure for reducing in-site reflection of light back into the die, reducing thermal damage to the LED die, and increasing light emanation efficiency.

(3) In the LED epitaxial substrate cutting method, an epitaxial substrate having a three-dimensional optic structure is provided to help reduce the occurrence of stress in the subsequent operation of epitaxial processing and to have light overlapping each other for increasing light output efficiency of LED.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
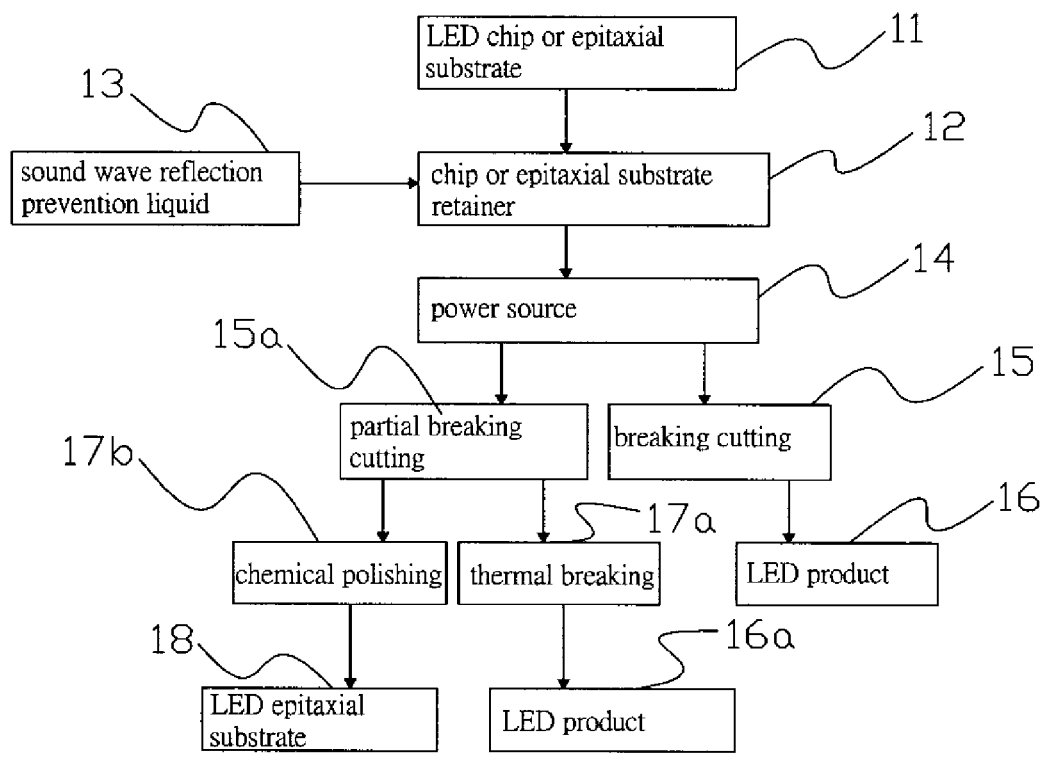
FIG. 1 is a flow chart showing a light-emitting diode (LED) cutting method in accordance with the present invention.

The present invention provides a light-emitting diode (LED) cutting method, which is carried out by following the steps shown in FIG. 1 by employing an acting force of up-and-down piston-like movement induced by volume expansion/contraction generated by an electrically-driven magnetostrictive material or piezoelectric ceramic material (namely conversion of electrical energy into mechanical energy) to serve as a power source for cutting an LED die or partially cutting an LED epitaxial substrate; a cutter that is formed in a desired cutting edge configuration by attaching electroformed diamond or CBN or SiC micro-particles to an end thereof to serve as a cutting tool; a sound-wave reflection prevention liquid medium serving as a sound-wave reflection prevention layer between the tool and the die; and a chip die retainer serving as a retainer for the operation of cutting the LED die or the LED epitaxial substrate, so as to produce products.

Embodiment 1

Figure 2:
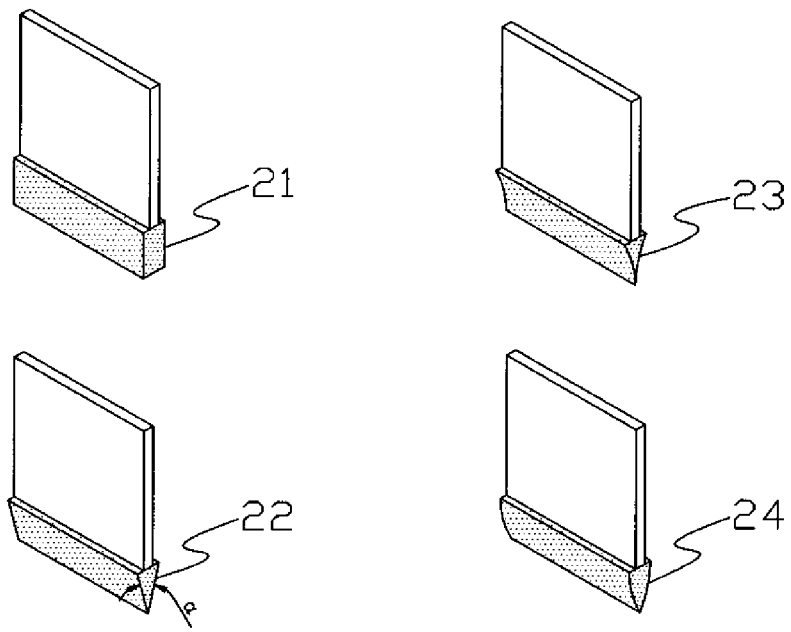
FIG. 2 shows parallel and non-parallel cutting tools in accordance with the present invention.

The power source 14 electrically drives a magnetostrictive material Cr(20)Al(3)Fe alloy. The sound wave prevention medium is pure water 13. The cutting tool set comprises cutting edges 21, 22, 23, 24 shown in FIG. 2. The processed object is an LED chip 11, which is placed and retained on a die retainer, and a process comprising the steps of FIG. 1 is carried out. The embodiment is intended to illustrate the present invention, not to limit the scope of the present invention.

A. First, the LED chip 11 is positioned and retained on the chip retainer 12 for subsequent use.

B. Next, the sound wave prevention medium of pure water 13 is activated to flow from an upper side to a lower side to pass through the cutting tool 15 and the chip retainer 12 to serve as a sound wave prevention medium between the cutting tool and the chip and also serving as a coolant and functioning for removal of wastes.

C. Further, the power source 14 of the magnetostrictive material Cr(20)AL(3)Fe alloy is activated to generate an impacting force of an up-and-down piston-like movement.

D. The micro-particles on the surface of the cutting tool are intermittently forced into the LED die to carry out breaking cutting 15 of the LED die and once the cutting operation is completed, the power source 14 and the supply of the pure water 13 of the sound wave prevention medium are cut off and the broken and cut LED dies are removed and subjected to quality control sieving and grading as final product dies.

Figure 6:
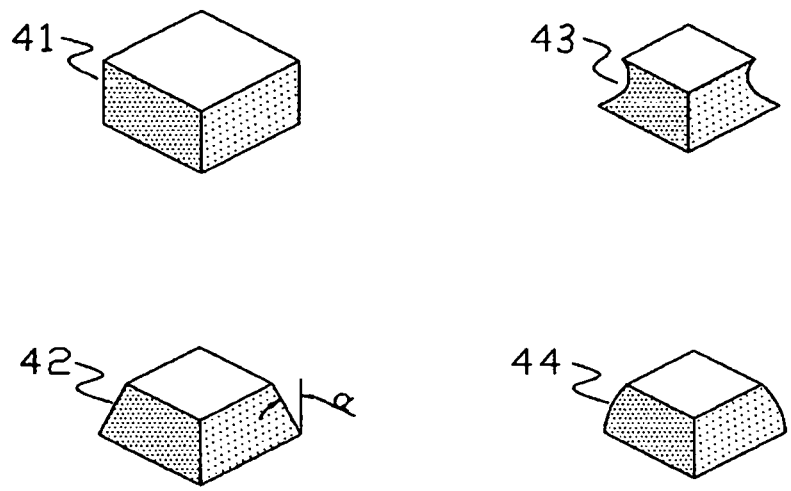
FIG. 6 shows LED die products having coarse facets produced by the present invention.

After the four steps of A, B, C, and D, the LED cutting method of the present invention is completed. The product dies so cut having coarsened facets are the first feature of the present invention and the LED die product having a cut facet configuration complementary to the surface shape of the cutting edge is the second feature of the present invention. For example, the cutting edge 21 forms an LED die 41 having coarse and parallel cut facets; the cutting edge 22 forms an LED die 42 having coarse and non-parallel cut facets; the cutting edge 23 forms an LED die 44 having coarse and non-parallel cut facets; and the cutting edge 24 forms an LED die 43 having coarse and non-parallel cut facets (as shown in FIG. 6).

A preferred one of the products of the present invention is an LED die having non-parallel and coarse facets, which extensively overcomes total reflection and also overcomes in-site reflection of the reflection light back into the die. The second preferred one is an LED die product having parallel and coarse facets.

Embodiment 2

The steps illustrated in FIG. 1 are followed. The power source 14 electrically drives a PZT piezoelectric material.

Figure 4:
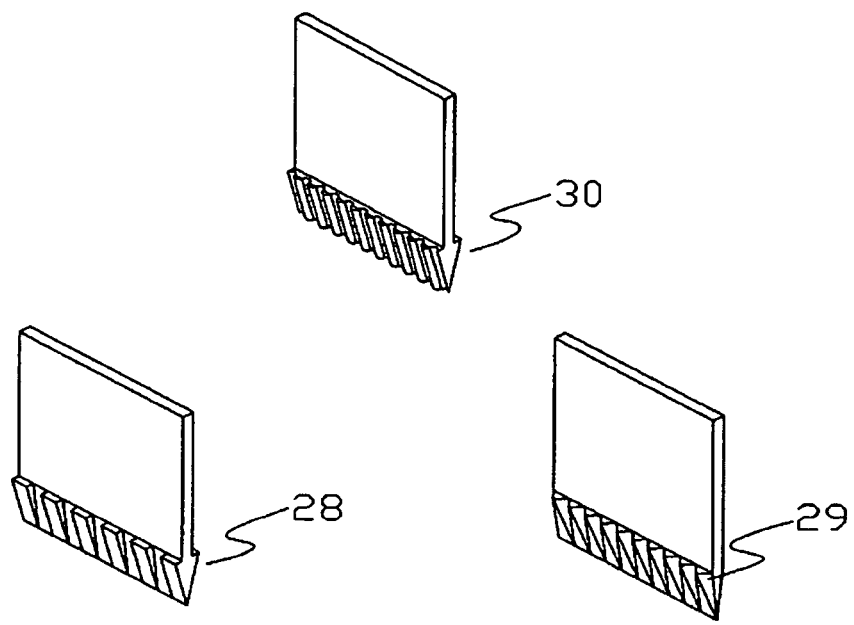
FIG. 4 shows non-parallel cutting tools with prism-like projections in accordance with the present invention.

The sound wave prevention medium may be selected from pure water or water mixed with alcohol (for preventing icing). The cutting tools used comprise cutting edges 28, 29, 20, 30 shown in FIG. 4. The processed object is an LED chip 11, which is placed and retained on a chip retainer. The operation process is also the same cutting method described in EMBODIMENT 1 for producing LED die products.

A. First, the LED chip 11 is positioned and retained on the chip retainer 12 for subsequent use.

B. Next, the sound wave prevention medium of pure water 13 is activated to flow from an upper side to a lower side to pass through the cutting tool 15 and the chip retainer 12 to serve as a sound wave prevention medium between the cutting tool and the chip and also serving as a coolant and functioning for removal of wastes.

C. Further, the power source 14 of the PZT piezoelectric material is electrically driven to generate an impacting force of up-and-down piston-like movement.

D. The micro-particles on the surface of the cutting tool are intermittently forced into the LED chip to carry out breaking cutting 15 of the LED chip and once the cutting operation is completed, the power source 14 and the supply of the sound wave prevention medium 13 are cut off and the broken and cut LED dies are removed and subjected to quality control sieving and grading as final product dies.

Figure 8:
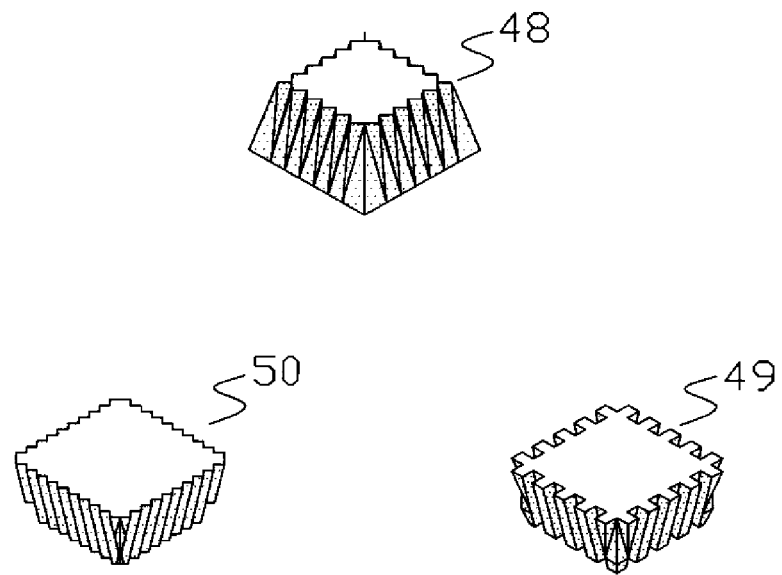
FIG. 8 shows LED die products having non-parallel coarse facets forming successive prism-like projections produced by the present invention.

After the four steps of A, B, C, and D, the LED cutting method of the present invention is completed. The product dies so cut having coarsened facets are the first feature of the present invention and the LED die product having a cut facet configuration complementary to the corrugated surface shape of the cutting edge is the second feature of the present invention. For example, the cutting edge 28 forms an LED die 49 having coarse and non-parallel facets forming rectangular prism like projections; the cutting edge 29 forms an LED die 48 having coarse and non-parallel facets forming triangle conic projections: and the cutting edge 30 forms an LED die 50 having coarse and non-parallel facets forming curved projects (as shown in FIG. 8).

A preferred one of the products of the present invention is an LED die having non-parallel and coarse facets, which extensively overcomes total reflection and also overcomes in-site reflection of the reflection light back into the die. The second preferred one is a conic LED die product having parallel and coarse facets.

Embodiment 3

Figure 7:
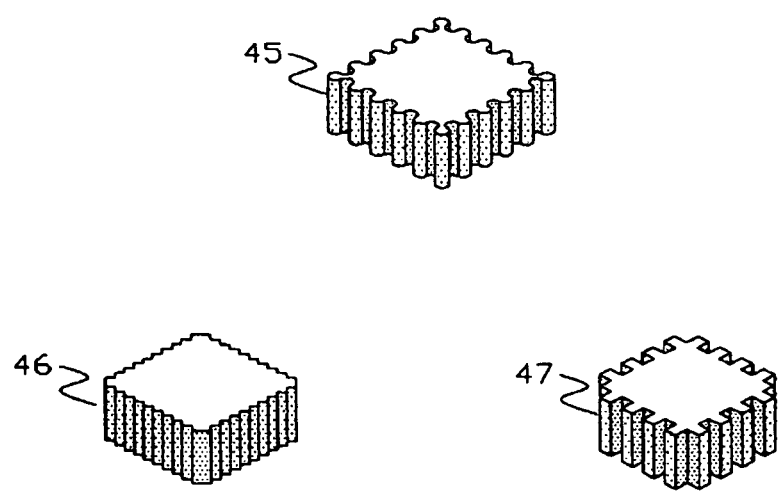
FIG. 7 shows LED die products having coarse facets forming successive prism-like projections produced by the present invention.

The steps illustrated in FIG. 1 are followed and the operation process is also the same cutting method described in EMBODIMENT 1 for producing LED die products. The cutting tools used comprise cutting edges 25, 26, 27 shown in FIG. 3 and the LED cutting process of the present invention is completed after taking the four steps of A, B, C, and D. The product dies so cut having coarsened facets are the first feature of the present invention and the LED die product having a cut facet configuration complementary to the corrugated surface shape of the cutting edge is the second feature of the present invention. For example, the cutting edge 25 forms an LED die 46 having coarse facets forming parallel triangular prism like projections; the cutting edge 26 forms an LED die 45 having coarse facets forming parallel curved projections; and the cutting edge 27 forms an LED die 47 having coarse facets forming parallel rectangular prism like projections (as shown in FIG. 7).

Embodiment 4

Figure 3:
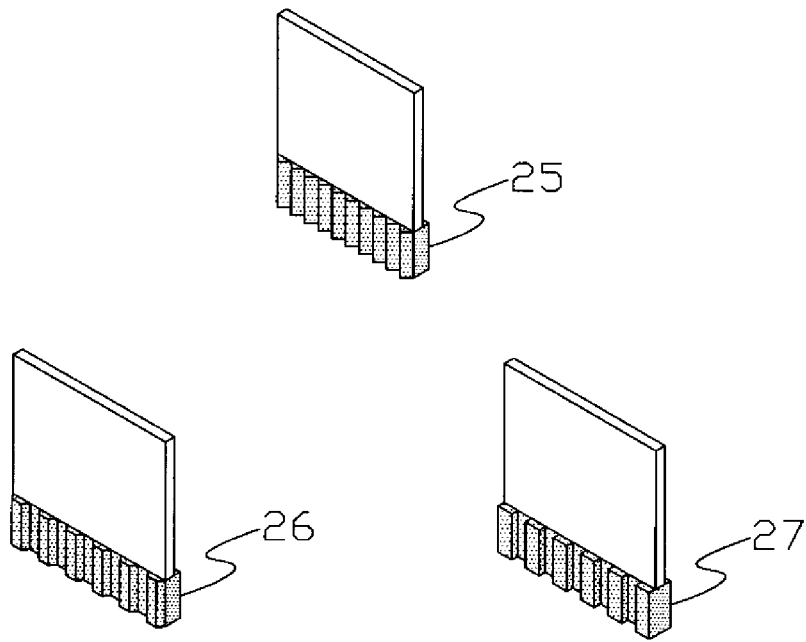
FIG. 3 shows parallel cutting tools with prism-like projections in accordance with the present invention.

The steps illustrated in FIG. 1 are followed. The power source 14 electrically drives LiNbO₃ piezoelectric material. The sound wave prevention medium is water mixed with alcohol (for preventing icing). The cutting tools used comprise cutting edges 25, 26, and 27 as shown in FIG. 3. The processed object is an LED chip 11, which is placed and retained on a chip retainer. The operation process is also the same cutting method as described above for producing LED die products, which goes through three steps of A, B, and C, but in a different step (Da), where LED cutting is carried out, the cutting operation is only carried out to such an extent of partial cutting 15a that cuts to a thickness that is close to but not damaging a surface of the chip retainer, at which the cutting operation is stopped and in a further step (E), the cut LED chip is removed to be subjected to heating with high temperature gradient to break the chip with thermal shock 17a to thereby complete the die products. The operation is carried out by following the steps:

A. First, the LED chip 11 is positioned and retained on the chip retainer 12 for subsequent use.

B. Next, the sound wave prevention medium of water mixed with alcohol 13 is activated to flow from an upper side to a lower side to pass through the cutting tool 15 and the chip retainer 12 to serve as a sound wave prevention medium between the cutting tool and the chip and also serving as a coolant and functioning for removal of wastes.

C. Further, the power source 14 of the LiNbO₃ piezoelectric material is electrically driven to generate an impacting force of up-and-down piston-like movement.

Da. The micro-particles on the surface of the cutting tool are intermittently forced into the LED chip to carry out breaking cutting 15 of the LED chip and the cutting operation is carried out to such an extent that cuts to a thickness that is closest to but not damaging a surface of the chip retainer at which the cutting operation is stopped; and once the cutting operation is completed, the power source 14 and the supply of the sound wave prevention medium 13 are cut off.

E. The partially cut LED chip 11 is removed and is subjected to heating with a high temperature gradient to break the die with thermal shock 17a to thereby complete the die products, which are then subjected to quality control sieving and grading as final product dies.

Figure 9:
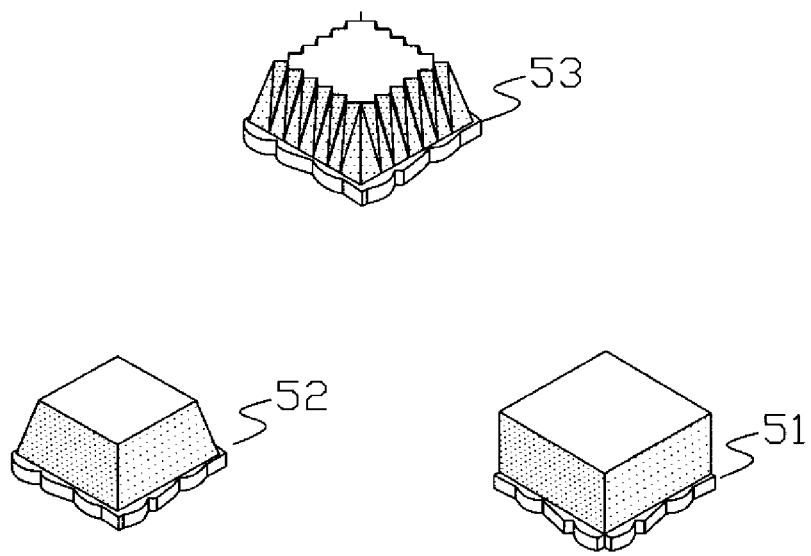
FIG. 9 shows LED dies produced by a partial cutting method in accordance with the present invention.

After the five steps of A, B, C, Da and E, the LED cutting method of the present invention is completed. The product dies so cut having coarsened facets are the first feature of the present invention; the LED die product having a cut facet configuration complementary to the surface shape of the cutting edge is the second feature of the present invention; and the LED die product having residual burrs of breaking is the third feature of the present invention. For example, the cutting edge 21 forms an LED die 51 having coarse and parallel facets; the cutting edge 22 forms an LED die 52 having coarse and non-parallel facets; and the cutting edge 29 forms an LED die 53 having coarse and non-parallel facets forming conic projections (as shown in FIG. 9). A preferred one of the products of the present invention is an LED die having non-parallel and coarse facets, which extensively overcomes total reflection and also overcome in-site reflection of the reflection light back into the die. The second preferred one is a conic LED die product having parallel and coarse facets forming prism like projections.

Embodiment 5

Figure 5:
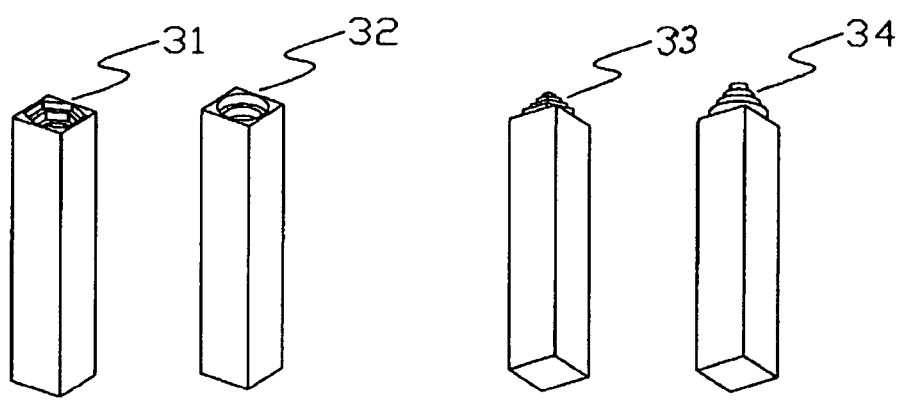
FIG. 5 shows cutting tools with projecting and recessed steps in accordance with the present invention.

The steps illustrated in FIG. 1 are followed. The power source 14 electrically drives a PZT piezoelectric material. The sound wave prevention medium is pure water. The cutting tools used comprise cutting edges 31, 32, 33, 34 shown in FIG. 5 to which electroformed super-hard micro-particles of diamond are attached. The processed object is Al₂O₃ serving as an LED epitaxial substrate. The operation process is the same as the above discussed breaking cutting process for producing LED die products. First, Al₂O₃ epitaxial substrate material 11 is positioned and retained on an epitaxial substrate retainer 12, following by carrying out partial cutting as described above. When a final step that has an altitude difference from a horizontal surface of the substrate by odd times of (¼) λ wavelength optic thickness, the cutting operation is stopped. The Al₂O₃ epitaxial substrate so cut is removed and is then subjected to chemical polishing with fluorides or fluoric acid and then washed to produce an LED epitaxial carrier substrate. The operation is carried out by following the steps:

A. First, the LED epitaxial substrate (11) Al₂O₃ is positioned and retained on the epitaxial substrate retainer 12 for subsequent use.

B. Next, the sound wave prevention medium of pure water 13 is activated to flow from an upper side to a lower side to pass through the cutting tool 31, 32, 33, 34 and drip onto the Al₂O₃ epitaxial substrate and the epitaxial substrate retainer 12.

C. Further, the PZT piezoelectric material is electrically driven to serve as a power source 14 that generates an impacting force of up-and-down piston-like movement.

Da. The cutting operation of the LED epitaxial substrate Al₂O₃ is carried out to such an extent that does not damage the epitaxial substrate Al₂O₃ and reaches odd number times of (¼) λ wavelength optic thickness at which the cutting operation is stopped.

F. The LED epitaxial substrate is removed and is subjected to chemical polishing with fluorides or fluoric acid and then washed to produce an LED epitaxial substrate.

Figure 10:
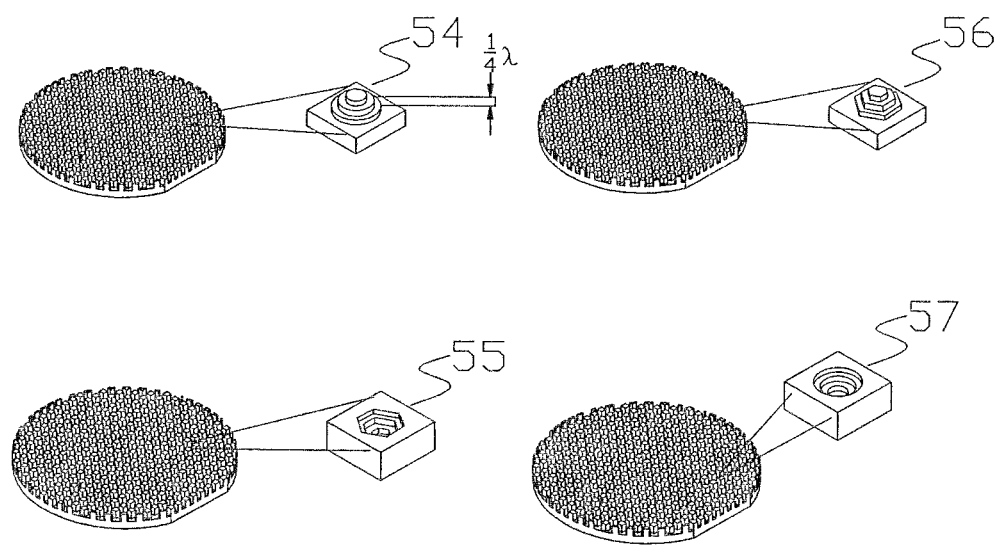
FIG. 10 shows an LED epitaxial substrate having successive periodic recessed/projecting steps produced by the present invention.

After the five steps of A, B, C, Da, and F, the LED epitaxial substrate partial cutting method of the present invention is completed. The product epitaxial substrate so cut having a surface forming at least one step that is smaller than a planar surface area of the main body thereof so as to provide an externally projecting or internally recessed periodic successive stepped LED epitaxial substrate as shown in FIG. 9 is the feature of the present invention. For example, the cutting edge 31 forms an LED epitaxial substrate product 56 that is complementary in surface shape thereto; the cutting edge 32 forms an LED epitaxial substrate product 54 that is complementary in surface shape thereto; the cutting edge 33 forms an LED epitaxial substrate product 55 that is complementary in surface shape thereto; and the cutting edge 34 forms an LED epitaxial substrate product 57 that is complementary in surface shape thereto (as shown in FIG. 10).

The LED epitaxial substrate partial cutting method of the present invention features a product LED epitaxial substrate having a surface that forms at least one step that is smaller than a planar surface area of the main body thereof so as to provide a polygonal externally projecting or internally recessed periodic successive stepped LED epitaxial substrate. The step can be hexagonal, circular, rectangular, or multilateral, so that the whole LED epitaxial substrate so formed has a surface forming a plurality of periodic successive externally projecting or internally recessed steps that is smaller than the die, as shown in FIG. 9. When used, due to uneven thicknesses, overlapping of light will occur during the light reflection or light transmission, thereby enhancing the brightness. The most preferred is at least While certain novel features of this invention have been shown and described and are pointed out in the annexed claims, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A light-emitting diode (LED) cutting method comprising the following steps: (A) positioning and retaining an LED die on a die retainer in such a way that a working surface of the LED die is exposed; (B) activating a source of pure water, which prevents reflection of sound waves, to flow in between a cutting tool and the LED die; (C) operatively driving a magnetostrictive material or piezoelectric ceramic material by actuating a power source to convert an electrical energy into a mechanical energy to induce volume expansion/compression that generates an up-and-down piston-like operation to induce a reciprocal movement in a direction substantially perpendicular to the working surface; and (D) applying the reciprocal movement to operate the cutting tool, having micro-particles of diamond, CBN, or SiC electroformed on a surface of said cutting tool, to intermittently force the micro-particles on said cutting tool into the working surface of the LED die to generate a large impacting force on a small contact area on said LED die for breaking cutting in said LED die, wherein the cutting tool has a surface having at least one prism-like projection that faces the LED die.

2. The LED cutting method according to claim 1, wherein the cutting tool of step (D) is made of a cutting material selected from the group consisting of titanium, steel, aluminum, copper, and alloys thereof, said cutting tool having a front end on which super hard micro-particles of diamond, SiC or CBN are electroformed for cutting the LED die.

3. The LED cutting method according to claim 1, wherein the cutting tool comprises a facet-parallel cutting tool that forms a plurality of successive raised/recessed prism-like projections on the surface, the raised/recessed prism-like projections having a configuration selected from the group consisting of triangle, circle, and rectangle, to provide an LED die cutting tool with facet-parallel prism-like projections.

4. The LED cutting method according to claim 1, wherein the cutting tool has a sharp edge that forms an acute angle that is greater than zero degrees and smaller than a critical angle of a material of an LED die, so as to form a cutting tool having two non-parallel side faces serving as a cutting tool for cutting the LED die to form non-parallel facets of the LED die.

5. The LED cutting method according to claim 1, wherein the cutting tool comprises a non-parallel faced sharp LED cutting tool that includes successive raised and recessed prism-like projections formed on at least a sharp facet of said cutting tool, the raised and recessed prism-like projections being triangular or circular or rectangular or conic shape.

6. The LED cutting method according to claim 1, wherein the cutting method produces an LED die product, which has a facet forming a coarse surface that corresponds to the sizes of micro-particles attached to a cutting edge surface of the cutting tool, and the LED die product has a configuration complementary to a surface shape of the cutting edge.

7. The LED cutting method according to claim 1, wherein the cutting method produces an LED die product, which has a facet forming a coarse surface that corresponds to a particle size of a cutting edge surface of the cutting tool, and the LED die product has opposing side facets that are parallel.

8. The LED cutting method according to claim 1, wherein the cutting method produces an LED die product, which has a facet forming a coarse surface that corresponds to a particle size and shape of a cutting edge surface of the cutting tool, and the LED die product has opposing side facets that are parallel and form successive raised and recessed prism-like projections.

9. The LED cutting method according to claim 1, wherein the cutting method produces an LED die product, which has a facet forming a coarse surface that corresponds to a particle size and shape of a cutting edge surface of a sharp cutting tool, and the LED die product has opposing side facets that are not parallel.

10. The LED cutting method according to claim 1, wherein the cutting method produces an LED die product, which has a facet forming a coarse surface that corresponds to a particle size and shape of a cutting edge surface of a sharp cutting tool, and the LED die product has opposing side facets that are not parallel and are of successive raised and recessed prism-like projections.

11. An LED partial cutting method comprising the following steps: (A) positioning and retaining an LED die workpiece on a die retainer in such a way that a working surface of the LED die workpiece is exposed; (B) activating a source of pure water, which prevents reflection of sound waves, to flow in between a cutting tool and the LED die workpiece; (C) operatively driving a magnetostrictive material or piezoelectric ceramic material by actuating a power source to convert an electrical energy into a mechanical energy to induce volume expansion/compression that generates an up-and-down piston-like operation to induce a reciprocal movement in a direction substantially perpendicular to the working surface; (Da) applying the reciprocal movement to operate the cutting tool having micro-particles of diamond, CBN, or SiC attached to a surface of said cutting tool, to carry out a cutting operation by forcing the micro-particles on said cutting tool into the working surface of the LED die workpiece to such an extent that the cutting tool cuts to a thickness that is the most closest to but not damaging a surface of the die retainer at which point the cutting operating is stopped, wherein the cutting tool has a surface having at least one prism-like projection that faces the LED die workpiece; and (E) subjecting the partially cut LED die workpiece to thermal breaking to form an LED die product.

12. The LED partial cutting method according to claim 11, wherein the method produces the LED die product, which has a facet forming a coarse surface that corresponds to particle sizes of the micro-particles attached to a cutting edge, and the LED die product having a facet complementary to a surface shape of the cutting edge; and forming an irregular facet induced by thermal breaking.

* * * * *